United States Patent [19]

Shigezane

[11] Patent Number: 5,573,567
[45] Date of Patent: Nov. 12, 1996

[54] METHOD OF MANUFACTURING SAMPLE TUBE FOR NUCLEAR MAGNETIC RESONANCE

[75] Inventor: Masahiro Shigezane, Hachioji, Japan

[73] Assignee: Shigemi Co., Ltd., Allison Park, Pa.

[21] Appl. No.: 571,285

[22] Filed: Dec. 12, 1995

Related U.S. Application Data

[63] Continuation of Ser. No. 268,029, Jun. 29, 1994, abandoned.

[30] Foreign Application Priority Data

Jun. 30, 1993 [JP] Japan ........................... 5-187001

[51] Int. Cl.$^6$ .................................... C03B 23/04
[52] U.S. Cl. .......................... 65/108; 65/102; 65/110
[58] Field of Search .................... 65/61, 102, 108, 65/110, DIG. 9; 264/454, 458, 571

[56] References Cited

U.S. PATENT DOCUMENTS

| | | | |
|---|---|---|---|
| 3,179,508 | 4/1965 | Stapel | 65/108 X |
| 3,235,290 | 2/1966 | Young | 65/108 X |
| 3,343,934 | 9/1967 | Rexford | 65/108 X |
| 3,416,343 | 12/1968 | Thielsch | 65/108 |
| 3,607,098 | 9/1971 | Strande | 422/102 |
| 3,880,012 | 4/1975 | Shapcott | 422/102 |
| 3,955,953 | 5/1976 | Hauser | 65/108 X |
| 4,549,136 | 10/1985 | Zens | 324/308 |

FOREIGN PATENT DOCUMENTS

| | | |
|---|---|---|
| 8808738 | 10/1988 | Germany . |
| 63-128244 | 5/1988 | Japan . |

OTHER PUBLICATIONS

H. Yamada et al. "Spinning Glass Cell . . . " Review of Scientific Instruments, vol. 62, No. 3. 1 Mar. 1991, New York, U.S., pp. 700–704.

S. Takahasi et al. "A Novel NMR Microcell . . . " Journal of Magnetic Resonance, vol. 76, No. 2, Feb. 1988, Orlando NN US pp. 347–351.

L. D. Field et al. "Sample Tube for Medium . . . " Analytical Chemistry, vol. 63, No. 2, 15 Jan. 1991, Columbus U.S. pp. 184–186.

54S–PPT Wilmad Catalogue, 10–11, 1993, Wilmad Glass Co. Buirra N.J. 08310.

508–CP and 510–CP, Wilmad Resonace Reports, NMR–8 (1990) 4 pages.

Wilmad Resonance Report, NMR 009, 3 pages.

*Primary Examiner*—Jill Warden
*Assistant Examiner*—Harold Y. Pyon
*Attorney, Agent, or Firm*—Ladas & Parry

[57] ABSTRACT

The method for manufacturing a sample tube for the use in a nuclear magnetic resonance apparatus comprising the steps of: inserting a core bar into a tubular body made of glass or quartz, the core bar having a stepped portion and a remaining portion, the portion of the core bar with the stepped portion corresponding to a sample receiving chamber being larger in diameter than the remaining portion; gradually inserting the tubular body into an electric furnace for heating while allowing suction from a vacuum pump to act on the interior of the tubular body, thereby the whole tubular body being intimately attached for shaping to and along an outer peripheral surface of the core bar; withdrawing the core bar outside from a lower end opening of the tubular body; sealing by heating the lower end opening of the tubular body to form a bottom of the tube; and grinding the peripheral surface so that the whole tubular body will be equal in outer diameter.

4 Claims, 1 Drawing Sheet

METHOD OF MANUFACTURING SAMPLE TUBE FOR NUCLEAR MAGNETIC RESONANCE

This application is a continuation of application Ser. No. 0 8/268,029 filed on Jun. 29, 1994, now abandoned.

BACKGROUND OF THE INVENTION

1. Field of the Invention

This invention relates to a nuclear magnetic resonance (NMR) apparatus used in the field for analyzing a sample of low concentration with the use of a superconducting magnet, and more specifically to a structure of a sensitive sample tube used in a nuclear magnetic resonance apparatus and a method for manufacturing the sample tube.

2. Brief Description of the Prior Art

In general, a nuclear magnetic resonance apparatus is required to use a sample tube having a thinnest possible wall thickness in order to make a sensitive measurement because a detector using the sample tube usually sets the outer diameter of the test tube to be very small such as, for example, 5 mm to 10 mm. Therefore, sample tubes, which are conventionally used as thin wall tube, are formed of a special hard glass material or the like with the wall thickness of the sample tubes as thin as 0.4 mm.

However, sample tubes with a further reduced wall thickness than mentioned above, such as the ultra thin wall, are fragile which makes it very difficult to use in comparison to a conventional thin wall tube. Therefore, even further reductions in the wall thickness of the ultra thin wall sample tubes is naturally limited. Also, the conventional ultra thin wall sample tube is made such that it has a uniform wall thickness over the entire body thereof, in order to obtain a sensitive measurement, in spite of the fact that a sample measurement by a nuclear magnetic resonance apparatus is actually carried out with respect to a very limited part (sample receiving chamber) in the vicinity of a bottom portion of the sample tube. This makes it even more difficult to make the sample tube, which is liable to break during the process of manufacture. Furthermore, since such sample tubes are manufactured on a small production basis by experienced and skilled workers, the production costs are prohibitively high. Moreover, the open ends of such sample tubes can easily break. Several times of use makes it practically impossible to use them even if handling is made with utmost care. In addition, it is difficult to cut such a thin tube, particularly at the opening area. Therefore, a specially-designed cutting machine is required. The need for the use of such a special cutting machine again results in increased production costs.

The present invention has been accomplished in view of the above.

OBJECT AND SUMMARY OF THE INVENTION

It is therefore an object of the present invention to provide a sample tube for use in a nuclear magnetic resonance apparatus, in which a higher sensitivity measurement can be achieved and which has a mechanical strength equal to or more than a typical conventional thin wall sample tube.

In accordance with the present invention there is provided a sample tube for use in nuclear magnetic resonance apparatus comprising a sample tube made of a glass or quartz and having an open end at one end and a closed end at the other end, said sample tube having a cylindrical sample receiving chamber defined therein adjacent said closed end, a wall thickness of said sample receiving chamber being thinner than a wall thickness of a remaining cylindrical portion including the wall thickness adjacent the open end of said sample tube.

In order to achieve the above object, the present invention employs the following means.

(1) A wall thickness of a cylindrical sample receiving chamber in a sample tube, which is formed of a glass or quartz, is made thinner than that of a remaining cylindrical portion of the tube.

(2) A core bar with a stepped portion, whose portion corresponding to the sample receiving chamber is larger in diameter than the remaining portion, is inserted into a tubular body formed of a glass or quartz, and the tubular body is gradually inserted into an electric furnace for heating while allowing suction from a vacuum pump to act on the interior of the tubular body, thereby the whole tubular body is intimately attached for shaping to and along an outer peripheral surface of the core bar and the core bar withdrawn away from a lower end opening of the tubular body after the lower end is cut open. Then the lower end opening is heated and sealed to form a closed bottom and the peripheral surface is ground so that the whole tubular body will be equal in outer diameter. Usually the wall thickness of the remaining cylindrical portion of the tube is at least 0.4 mm preferably at least 0.5 mm, and the wall thickness of the receiving chamber is no greater than 0.3 mm.

The above invention is carried out as follows.

According to the means of the above (1), since the wall thickness of that portion of the sample receiving chamber which is subjected to measurement of the sample is reduced, there can be obtained a higher sensitivity measurement, and since the wall thickness of the part of the sample tube other than the receiving chamber is thicker, the sample tube exhibits mechanical strength equal to or more than the typical conventional thin wall sample tube. Since the portion having thinner wall thickness is limited to about one quarter of the total tube, breakage of the sample tube can be reduced during the manufacturing process and therefore, a mass production can be achieved. In addition, the opening portion of the sample tube can easily be cut.

According to the means of the above (2), if a core bar with a stepped portion is inserted into a tubular body and vacuum formed while heating, that portion of the tubular body corresponding to the sample receiving chamber is formed slightly outward by the stepped portion of the core bar. By grinding the outer surface of the outward portion of the sample receiving chamber so that the outer diameter of the whole tubular body becomes equal, the wall thickness of the sample receiving chamber is made thinner than the remaining portion in order to obtain a higher sensitivity measurement and to increase mechanical strength of the remaining portion.

Owing to the provision of the above-mentioned means, the above-mentioned object of the present invention can be achieved.

The above and other objects, features and advantages of the present invention and the manner of realizing them will become more apparent, and the invention itself will best be understood from a study of the following description and appended claims with reference to the attached drawings showing one preferred embodiment of the invention.

DETAILED DESCRIPTION OF THE EMBODIMENTS preferred embodiments of a sample tube for the use in a nuclear magnetic resonance apparatus and a method of manufacturing the same, both according to the present invention, will be described in detail with reference to the accompanying drawings.

Figure 1:
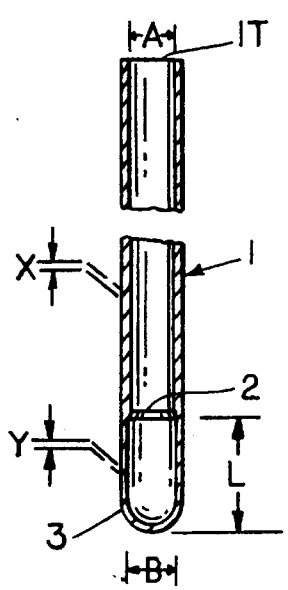
FIG. 1 is a front sectional view, partly omitted, of a sample tube for the use in a nuclear magnetic resonance apparatus according to one embodiment of the present invention.

FIG. 1 is a front sectional view, partly omitted, of a sample tube for the use in a nuclear magnetic resonance apparatus which is manufactured by a manufacturing method according to one preferred embodiment of the present invention. The glass tube can be made from Corning Glass 7740 (borosilicate glass). Reference 1 denotes a sample tube which is made of a glass or quartz material. The sample tube 1 has a wall thickness of about 0.4 ram, which is represented by reference character X. The sample tube 1 also has a stepped portion 2 through which a sample receiving chamber 3 is connected to an interior of a lower end of the sample tube 1. The wall thickness of the sample receiving chamber 3 (i.e., the wall thickness of that portion of the sample tube 1 where the sample receiving chamber 3 is formed) is about 0.2 mm, which is represented by reference character Y. A length L of the sample receiving chamber 3 is about 40 mm. The sample tube 1 is about 4.96 mm in outer diameter and about 4.16 mm in inner diameter, while the sample receiving chamber 3 is about 4.56 mm in inner diameter B. It is noted here that these dimensions are one preferred example and the present invention is by no means limited to this example. Reference numeral 1T denotes an opening portion, this being formed by cutting, of an upper end of the sample tube 1.

Next, a manufacturing method according to the present invention, for manufacturing the sample tube 1

FIG. 1 will be described with reference to FIGS. 2 to 6.

Figure 2:
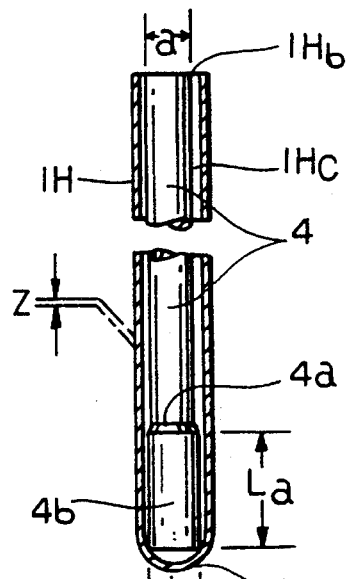
FIG. 2 is a front sectional view, partly omitted, of a first step of a manufacturing method according to one embodiment of the present invention.

FIG. 2 is a front sectional view showing a first step of a manufacturing method according to the present invention. First, a core bar 4 with a stepped portion 4a, whose lower end portion 4a corresponding to the sample receiving chamber 3 is larger in diameter than the remaining portion, is inserted into a tubular body 1H of a circular configuration in section, formed of a glass or quartz. In FIG. 2, reference numeral 1Ha denotes a bottom opening space of the tubular body 1H and reference numeral 1Hb denotes a top opening (upper end opening) thereof. Reference numeral 1Hc denotes a space between the core bar 4 and the tubular body 1H. A wall thickness Z of the tubular body 1H is about 0.4 mm to 0.6 mm, and a length La of a lower end portion 4b of the core bar 4 is generally longer than the length L of the sample receiving chamber 3. Moreover, an outer diameter a of the core bar 4 and an outer diameter b of the lower end portion 4b are generally equal to an inner diameter A of the sample tube I and an inner diameter B of the sample receiving chamber 3, respectively.

Figure 3:
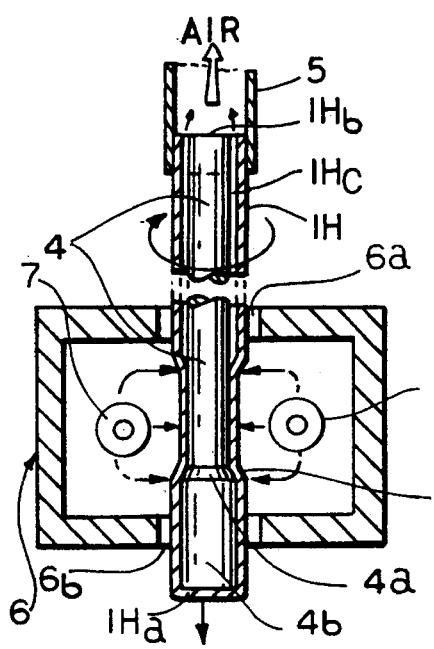
FIG. 3 is likewise a front sectional view, partly omitted, of a second step of the manufacturing method of present invention.

FIG. 3 is a front sectional view showing a second step of the present invention. In this second step, the top opening 1Hb of the tubular body 1H with the core bar 4 inserted therein is fitted in an inlet port 5 of a vacuum pump (not shown) so that the suction from the pump is allowed to act on the space 1Hc. In that condition, the entirety of the tubular body 1H, etc. is gradually inserted into an electric furnace 6 with heaters 7, 7 contained therein, from the top surface inlet port 6a. During the course of progress of the movement of the tubular body 1H within the electric furnace 6 from the top surface inlet port 6a toward a bottom surface outlet port 6b, the entirety of the tubular body 1H, etc. is heated so as to be intimately formed (vacuum-formed) on a peripheral surface of the core bar 4. In FIG. 3, reference numeral 1Hf denotes a stepped surface formed on the tubular body 1H in such a manner as to correspond to the stepped portion 4a of the core bar 4. The tubular body 1H thus vacuum-formed has a slightly outwardly expended portion 1Hd, this portion corresponding to the sample receiving chamber 3, on a lower end side thereof with reference to the stepped surface 1Hf.

Figure 4:
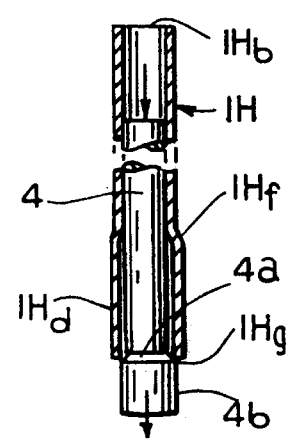
FIG. 4 is likewise a front sectional view, partly omitted, of a third step of the manufacturing method of the present invention.

FIG. 4 is a front sectional view showing a third step of the present invention, for withdrawing the core bar 4 from the inside of the vacuum-formed tubular body 1H. The core bar 4 is withdrawn from the lower end opening 1Hg of the tubular body 1H, first with the lower end portion 4b side having a larger diameter. This lower end opening 1Hg is formed by cutting or breaking the bottom surface 1Ha of the tubular body 1H.

Figure 5:
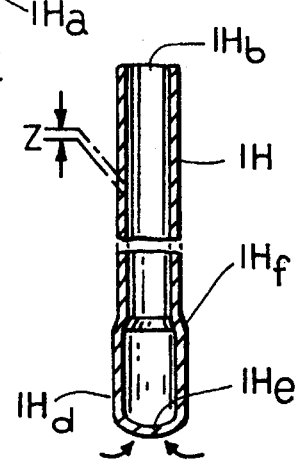
FIG. 5 is likewise a front sectional view; partly omitted, of a fourth step of the manufacturing method of the present invention.

FIG. 5 is a front sectional view showing a fourth step of the present invention, for forming the bottom surface 1He on the tubular body 1H by heating and sealing the lower end opening 1Hg of the vacuum-formed tubular body 1H from which the core bar 4 is already withdrawn. The sealing is effected by heating the lower end opening 1Hg by a heater (not shown). This sealing procedure is known and therefore, detailed description thereof is omitted.

Figure 6:
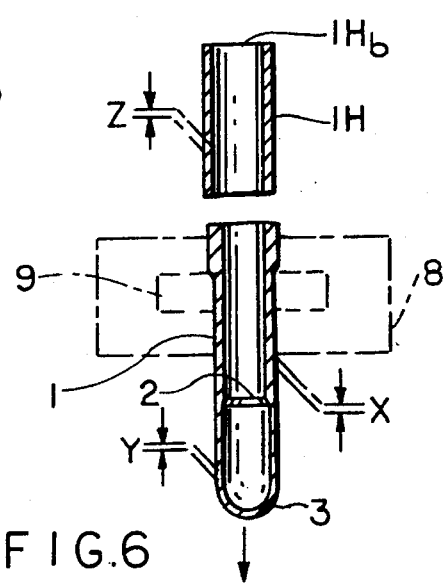
FIG. 6 is likewise front sectional view, partly omitted, of a fifth step of the manufacturing method of the present invention.

FIG. 6 is a construction diagram showing a fifth step of the present invention, in which the vacuum-formed tubular body 1H, whose bottom surface 1He is already subjected to sealing is ground with the use of a grinder 9 of a grinding machine 8 such as, for example, a centerless grinder, such that the outer diameter of the tubular body 1H is generally equal over the entire length thereof. Through the grinding operation by the grinder 9, there can be obtained the sample tube i in which only the wall thickness Y of the sample receiving chamber 3 at the lower end portion of the tubular body 1H is formed so thin as, for example, about 0.2 mm, and the wall thickness X of the remaining portion is about 0.4 mm. Finally, the tubular body 1H on the top opening 1Hb side is cut into a predetermined length dimension by a cutting machine (not shown), to form the opening portion 1T. In this way, a number, one, of the sample tube 1 is manufactured.

Since the sample tube for the use in a nuclear magnetic resonance apparatus manufactured according to the present invention is constructed in the manner as mentioned above, if a sample is received in the sample receiving chamber and analyzed by the nuclear magnetic resonance apparatus, an excellent result of analysis can be obtained because the thinner wall thickness of the sample receiving chamber ensures a sensitivity enhancement. Particularly, the wall thickness of that portion of the sample tube other than the sample receiving chamber is thicker in the present invention, so that a mechanical strength equal to or more than that of the typical conventional thin wall sample tube can be exhibited. Accordingly, breakage is reduced during the machining process and a mass production is possible. Moreover, production costs are low and sensitivity is enhanced. In addition, a sample tube for the use in a nuclear magnetic resonance apparatus according to the present invention has a long service life and withstand repeated use.

Although the invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

I claim:

1. A method for manufacturing a sample tube for the use in a nuclear magnetic resonance apparatus comprising the steps of:

inserting a core bar into a tubular body made of glass or quartz, said core bar having a stepped portion and a remaining portion, that portion of said core bar with the stepped portion corresponding to a sample receiving chamber being larger in diameter than the remaining portion;

gradually inserting said tubular body into an electric furnace for heating while allowing suction from a vacuum pump to act on the interior of said tubular body, thereby the whole tubular body being intimately attached for shaping to and along an outer peripheral surface of said core bar;

withdrawing said core bar outside from a lower end opening of said tubular body;

sealing by heating said lower end opening of said tubular body to form a bottom of the tube; and grinding the peripheral surface so that the whole tubular body will be equal in outer diameter.

2. A method according to claim 1, in which the resulting thickness of the bottom of the tube is no greater than 0.3 mm.

3. A method according to claim 1, in which the resulting thickness of the tubular body above the lower end is at least 0.4 mm.

4. A method according to claim 2, in which the resulting thickness of the tubular body above the lower end is at least 0.4 mm.

* * * * *